United States Patent
Su

(10) Patent No.: US 11,092,429 B2
(45) Date of Patent: Aug. 17, 2021

(54) FILM THICKNESS TEST APPARATUS AND METHOD AND VAPOR DEPOSITION DEVICE

(71) Applicants: BOE Technology Group Co., Ltd., Beijing (CN); Hefei Xinsheng Optoelectronics Technology Co., Ltd., Anhui (CN)

(72) Inventor: Chihwei Su, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 445 days.

(21) Appl. No.: 15/955,769

(22) Filed: Apr. 18, 2018

(65) Prior Publication Data
US 2019/0025045 A1 Jan. 24, 2019

(30) Foreign Application Priority Data
Jul. 24, 2017 (CN) .......................... 201710605307.8

(51) Int. Cl.
*C23C 14/54* (2006.01)
*C23C 14/50* (2006.01)
(Continued)

(52) U.S. Cl.
CPC .......... *G01B 11/0691* (2013.01); *C23C 14/24* (2013.01); *C23C 14/50* (2013.01);
(Continued)

(58) Field of Classification Search
CPC ...... C23C 14/50; C23C 14/543; C23C 14/545
See application file for complete search history.

(56) References Cited

U.S. PATENT DOCUMENTS 5,861,599 A * 1/1999 Smith .................... C23C 14/246
118/726
6,228,429 B1 * 5/2001 Bluck .................... B05D 3/145
118/503
(Continued)

FOREIGN PATENT DOCUMENTS

CN    101956176 A    1/2011
CN    102534573 A    7/2012
(Continued)

OTHER PUBLICATIONS

Second Office Action dated Sep. 11, 2019 corresponding to Chinese application No. 201710605307.8.
(Continued)

*Primary Examiner* — Dah-Wei D. Yuan
*Assistant Examiner* — Stephen A Kitt
(74) *Attorney, Agent, or Firm* — Nath, Goldberg & Meyer; Joshua B. Goldberg

(57) ABSTRACT

The present disclosure provides a film thickness test apparatus and method, and a vapor deposition device. The film thickness test apparatus is arranged for one process cavity, and the film thickness test apparatus comprises: a test assembly; a transport assembly configured to, when moving towards the process cavity, drive the test assembly into the process cavity so that the test assembly is vapor deposited in the process cavity to form a test film, and, when moving away from the process cavity, drive the test assembly out of the process cavity; and a drive assembly configured to drive the transport assembly to move along a direction towards/away from the process cavity.

18 Claims, 4 Drawing Sheets

(51) Int. Cl.
  *C23C 14/24* (2006.01)
  *H01L 51/56* (2006.01)
  *G01B 11/06* (2006.01)
  *G01B 21/08* (2006.01)
  *H01L 51/00* (2006.01)
(52) U.S. Cl.
  CPC .......... *C23C 14/543* (2013.01); *C23C 14/545* (2013.01); *G01B 11/0616* (2013.01); *G01B 21/08* (2013.01); *H01L 51/001* (2013.01); *H01L 51/56* (2013.01); *H01L 2251/558* (2013.01)

(56) References Cited

U.S. PATENT DOCUMENTS

| | | | | |
|---|---|---|---|---|
| 2005/0120956 | A1* | 6/2005 | Suzuki | C23C 16/507 118/719 |
| 2008/0223291 | A1* | 9/2008 | Bruce | C23C 14/50 118/50.1 |
| 2013/0248611 | A1* | 9/2013 | Ares | C23C 16/4558 239/1 |

FOREIGN PATENT DOCUMENTS

| | | |
|---|---|---|
| CN | 203349788 U | 12/2013 |
| CN | 203569182 U | 4/2014 |
| CN | 104087908 A | 10/2014 |
| CN | 203999802 U | 12/2014 |
| CN | 105734520 A | 7/2016 |
| CN | 106574365 A | 4/2017 |
| CN | 206843576 U | 1/2018 |
| JP | 2014-19883 A | 2/2014 |

OTHER PUBLICATIONS

Office Action dated Jan. 28, 2019 issued in corresponding Chinese Application No. 201710605307.8.

* cited by examiner

FILM THICKNESS TEST APPARATUS AND METHOD AND VAPOR DEPOSITION DEVICE

CROSS-REFERENCE TO RELATED APPLICATION

This application claims the priority of Chinese Patent Application No. 201710605307.8 submitted to the Chinese Intellectual Property Office on Jul. 24, 2017, the disclosure of which is incorporated herein in its entirety by reference.

TECHNICAL FIELD

The present disclosure relates to the technical field of display technology, and in particularly relates to a film thickness test apparatus and method, as well as a vapor deposition device.

BACKGROUND OF THE INVENTION

In vapor deposition devices for Organic Light-Emitting Diodes (OLEDs), an evaporation source and a deposition rate detector are usually used in combination to control a thickness of the organic film layer during the production process. During the production process, a carrier, such as a silicon wafer or white glass, is transported into a process cavity by a transport means before the evaporation source deposits an organic material onto the carrier to form an organic film layer on the carrier. Then, the transport means transports the carrier out of the process cavity and a measuring means conducts thickness measurement. Based on the measurement result, a deposition rate parameter of the evaporation source is corrected to adjust a thickness of the deposited organic film layer, thereby improving the precision and uniformity in thickness of the deposited organic film layer.

However, during the process of testing the film thickness deposited by a certain evaporation source, the vapor deposition device is usually desired to be stopped to make space for the transport path of the carrier. The evaporation operation of other evaporation sources is also desired to be stopped, for example, by covering the evaporation source with a evaporation source cover, so as to test whether the film thickness deposited by each of the evaporation sources is uniform and precise one by one, and the production of the vapor deposition device cannot be restored until such test of all evaporation sources are finished.

Therefore, in the prior art, the production scheduling is more complicated and the film thickness test consumes a long time, thereby reducing productivity, increasing unnecessary waste of organic materials and risks of hole blockage on the evaporation source, and thus impairing the production reliability during continuous production.

SUMMARY

The present disclosure has been accomplished in order to at least partially solve the problems in the prior art. The present disclosure provides a film thickness test apparatus and method, and a vapor deposition device that can improve the production reliability during continuous production.

According to one aspect of the disclosure, there is provided a film thickness test apparatus arranged for one process cavity, the film thickness test apparatus comprises:

a test assembly;

a transport assembly configured to, when moving towards the process cavity, drive the test assembly into the process cavity so that the test assembly is vapor deposited in the process cavity to form a test film, and, when moving away from the process cavity, drive the test assembly out of the process cavity; and a drive assembly configured to drive the transport assembly to move along a direction towards/away from the process cavity.

The transport assembly may include a retractable member which has a hollow interior, and has one end connected to one end of the test assembly within the retractable member while the other end connected to the process cavity;

the drive assembly is configured to drive the retractable member to stretch/retract so that the one end of the retractable member is moved along a direction towards/away from the process cavity; and the retractable member is configured to, when the one end of the retractable member is moved towards the process cavity, drive the test assembly into the process cavity so that the test assembly is vapor deposited in the process cavity to form a test film, and, when the one end of the retractable member is moved away from the process cavity, drive the test assembly out of the process cavity.

The transport assembly may further include a cover, the one end of the retractable member is connected to one side of the cover, the one end of the test assembly is fixed on the one side of the cover, and the one end of the retractable member is connected to the one end of the test assembly via the cover.

The film thickness test apparatus may further include:

an air inlet assembly in communication with the retractable member and configured to control isolation or communication between the retractable member and ambient air; and an air outlet assembly in communication with the retractable member and configured to exhaust air from the interior of the retractable member so that the interior of the retractable member has the same vacuum degree as the process cavity.

The transport assembly may further include:

a first connecting member having one end fixed on and in communication with the one end of the retractable member and the other end fixed on the one side of the cover, the one end of the retractable member being connected to the one side of the cover via the first connecting member; and a second connecting member having one end fixed on and in communication with the other end of the retractable member and the other end connected to the process cavity, the other end of the retractable member being connected to the process cavity via the second connecting member.

The film thickness test apparatus may further include:

a switch assembly having one end connected to the other end of the second connecting member and the other end connected to the process cavity, the other end of the second connecting member being connected to the process cavity via the switch assembly, and the switch assembly being configured to control isolation or communication between the retractable member and the process cavity.

The switch assembly may be a pendulum valve.

The test assembly may include:

a toolbar having one end fixed on the one end of the transport assembly and is located within the transport assembly; and a substrate having one side fixed on the toolbar and the other side configured for vapor deposition of the test film.

The one end of the toolbar may be fixed onto the one side of the cover.

The drive assembly may be a drive screw which is disposed on two external sides of the transport assembly and connected to the transport assembly; and the drive screw operates to drive the transport assembly to move along a direction towards/away from the process cavity.

The cover may be provided with a first via and a first screw hole both penetrating the cover, the first connecting member may be provided with a second screw hole penetrating the first connecting member and corresponding to the first via on the cover, and a third screw hole not penetrating the first connecting member and corresponding to the first screw hole on the cover.

The film thickness test apparatus may further include:

a screw disposed in the first and third screw holes so that the first connecting member is fixed on the cover.

One end the drive screw may be fixed on the one end of the second connecting member, and the other end of the drive screw may be disposed in the second screw hole and the first via.

The retractable member may be a bellows.

The air inlet assembly may be in communication with the first connecting member, and the air outlet assembly may be in communication with the second connecting member.

According to another aspect of the disclosure, there is provided a vapor deposition device comprising a plurality of process cavities, each of which corresponding to one film thickness test apparatus as discussed above.

According to still another aspect of the disclosure, there is provided a film thickness test method based on a film thickness test apparatus arranged for a process cavity, the film thickness test apparatus comprises a transport assembly, a drive assembly connected to the transport assembly, and a test assembly connected to the transport assembly, the film thickness test method includes the steps of:

by the drive assembly, driving the transport assembly to move along a direction towards the process cavity;

by the transport assembly, driving the test assembly into the process cavity so that the test assembly is vapor deposited in the process cavity to form a test film;

by the drive assembly, driving the transport assembly to move along a direction away from the process cavity; and by the transport assembly, driving the test assembly to move so that the test assembly exits the process cavity when the vapor deposition of the test film is finished.

The film thickness test apparatus may further include an air inlet assembly, an air outlet assembly and a switch assembly, the transport assembly includes a cover, a retractable member, a first connecting member and a second connecting member, the retractable member has a hollow interior, the test assembly is fixed on the cover at one end and located within the retractable member, the first connecting member has one end fixed on and in communication with one end of the retractable member and the other end fixed on one side of the cover, the other end of the retractable member is fixed on and in communication with one end of the second connecting member, the other end of the second connecting member is connected to one end of the switch assembly, the other end of the switch assembly is connected to the process cavity, the air inlet assembly is in communication with the first connecting member, and the air outlet assembly is in communication with the second connecting member so that the air inlet assembly and the air outlet assembly are in communication with the retractable member, before the step of, by the drive assembly, driving the transport assembly to move along a direction towards the process cavity, the film thickness test method further includes:

by the air inlet assembly, isolating the retractable member from ambient air;

by the air outlet assembly, exhausting air from the interior of the retractable member so that the interior of the retractable member has the same vacuum degree as the process cavity; and by the switch assembly, communicating the retractable member with the process cavity, and after the step of, by the transport assembly, driving the test assembly to move so that the test assembly exits the process cavity when the vapor deposition of the test film is finished, the film thickness test method further includes:

by the switch assembly, isolating the retractable member from the process cavity, and by the air inlet assembly, communicating the retractable member with ambient air.

DETAILED DESCRIPTION

To improve understanding of the technical solution of the present disclosure for those skilled in the art, the film thickness test apparatus and method and vapor deposition device provided in the disclosure will be described below in detail in conjunction with the accompanying drawings.

Figure 1:
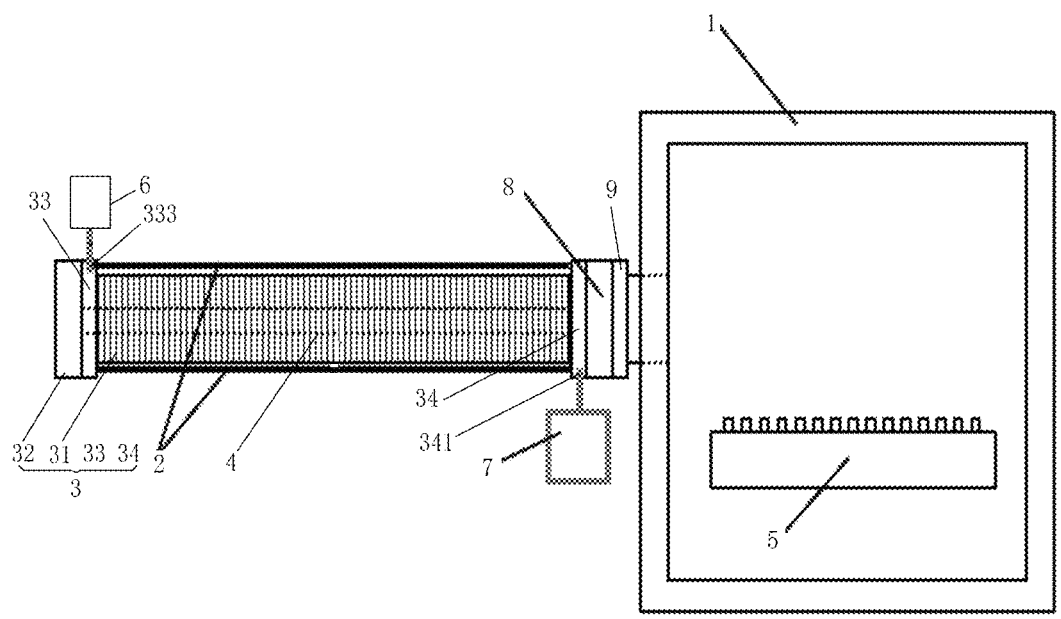
FIG. 1 is a schematic diagram illustrating a configuration of the film thickness test apparatus according to an exemplary embodiment of the disclosure.

According to one aspect of the disclosure, there is provided a film thickness test apparatus. FIG. 1 is a schematic diagram illustrating a configuration of the film thickness test apparatus according to an exemplary embodiment of the disclosure. As shown in FIG. 1, the film thickness test apparatus is arranged for a process cavity 1. The film thickness test apparatus includes a drive assembly 2, a transport assembly 3 and a test assembly 4. The drive assembly 2 is connected to the transport assembly 3, and the test assembly 4 is connected to the transport assembly 3.

The drive assembly 2 is configured to drive the transport assembly 3 to move along a direction towards/away from the process cavity 1.

The transport assembly 3 is configured to, when moving towards the process cavity 1, drive the test assembly 4 into the process cavity 1 so that the test assembly 4 is vapor deposited in the process cavity 1 to form a test film, and, when moving away from the process cavity 1, drive the test assembly 4 out of the process cavity 1.

In an exemplary embodiment of the disclosure, as shown in FIG. 1, the test assembly 4, which is shown by two dash lines, is located within the transport assembly 3.

In the exemplary embodiment of the disclosure, the transport assembly 3 is fixed at one end, for example, the transport assembly 3 may be fixed on the process cavity 1 at one end, and the drive assembly 2 is used for driving the other end of the transport assembly 3 to move along a direction towards/away from the process cavity 1. It should be noted that the transport assembly 3 may be moved along a direction towards/away from the process cavity 1 by other methods, which will not be listed herein one by one.

In the exemplary embodiment of the disclosure, the process cavity 1 is provided with an evaporation source 5, which deposits a test film on the test assembly 4 when the test assembly 4 enters the process cavity 1.

In the exemplary embodiment of the disclosure, the test assembly 4 is driven out of the process cavity 1 after vapor deposition of the test film is finished, and then is taken out of the film thickness test apparatus to conduct film thickness test on the test film.

In the exemplary embodiment of the disclosure, the transport assembly 3 includes a retractable member 31 which has a hollow interior. The retractable member 31 has one end connected to one end of the test assembly 4 located within the retractable member 31, and the other end connected to the process cavity.

In the exemplary embodiment of the disclosure, the other end of the retractable member 31 is fixed. The drive assembly 2 is configured to drive the retractable member 31 to stretch/retract so that the one end of the retractable member 31 is moved along a direction towards/away from the process cavity 1. Specifically, the drive assembly 2 drives the retractable member 31 to be compressed so that the one end of the retractable member 31 is moved towards the process cavity 1, or the drive assembly 2 drives the retractable member 31 to be stretched so that the one end of the retractable member 31 is moved away from the process cavity 1.

Retraction/stretch of the retractable member 31 may drive the test assembly 4 connected at one end of the retractable member 31 to move along a direction towards/away from the process cavity 1 so that the test assembly 4 can enter/exit the process cavity 1.

Specifically, the transport assembly 31 is configured to, when the one end is moved towards the process cavity 1, drive the test assembly 4 into the process cavity 1 so that the test assembly 4 is vapor deposited in the process cavity 1 to form a test film, and, when the one end is moved away from the process cavity 1, drive the test assembly 4 out of the process cavity 1.

In the exemplary embodiment of the disclosure, the retractable member 31 has a tubular structure, and two ends of the retractable member 31 are both provided with an opening while the interior of the retractable member 31 is hollow. In the exemplary embodiments of the disclosure, the retractable member 31 is a bellows.

In the exemplary embodiment of the disclosure, the transport assembly 3 further includes a separate cover 32 independent of the retractable member 31. The retractable member 31 has one end connected with one side of the cover 32, and the test assembly 4 has one end fixed on one side of the cover 32 and is located within the retractable member 31. It should be appreciated that the test assembly 4 is connected to the retractable member 31 via the cover 32. Specifically, the cover 32 has one side connected to an opening at one end of the retractable member 31, and is used to cover the opening. It should be appreciated that the cover 32 may also be a part of the retractable member 31. In the exemplary embodiment of the disclosure, the film thickness test apparatus further includes an air inlet assembly 6 and an air outlet assembly 7. The air inlet assembly 6 is in communication with the retractable member 31, while the air outlet assembly 7 is also in communication with the retractable member 31.

In the exemplary embodiment of the disclosure, the transport assembly 3 further includes a first connecting member 33 and a second connecting member 34 which are both hollow inside. One end of the first connecting member 33 is fixed on and in communication with one end of the retractable member 31, while the other end of the first connecting member 33 is fixed on one side of the cover 32. It should be appreciated that the one end of the retractable member 31 is connected to the one side of the cover 32 via the first connecting member 33. One end of the second connecting member 34 is fixed on and in communication with the other end of the retractable member 31, while the other end of the second connecting member 34 is connected to the process cavity 1. It should be appreciated that the other end of the retractable member 31 is connected to the process cavity 1 via the second connecting member 34. The air inlet assembly 6 is in communication with the first connecting member 33, while the air outlet assembly 7 is in communication with the second connecting member 34. That is, the air inlet assembly 6 is in communication with the retractable member 31 via the first connecting member 33, while the air outlet assembly 7 is in communication with the retractable member 31 via the second connecting member 34.

In the exemplary embodiment of the disclosure, the first connecting member 33 is provided with a second via 333 in communication with the hollow interior thereof. The air inlet assembly 6 is in communication with the first connecting member 33 through the second via 333 on the first connecting member 33 so as to realize communication between the air inlet assembly 6 and the retractable member 31. The second connecting member 34 is provided with a third via 341 in communication with the hollow interior thereof. The air outlet assembly 7 is in communication with the second connecting member 34 through the third via 341 on the second connecting member 34 so as to realize communication between the air outlet assembly 7 and the retractable member 31.

In the exemplary embodiment of the disclosure, the air inlet assembly 6 is a Clean Dry Air Vent (CDA Vent).

In the exemplary embodiments of the disclosure, the air outlet assembly 7 is a vacuum pump.

The air inlet assembly 6 is configured to control isolation or communication between the retractable member 31 and ambient air. Specifically, when the air inlet assembly 6 is closed, the retractable member 31 is isolated from the ambient air; and when the air inlet assembly 6 is opened, the retractable member 31 is in communication with the ambient air.

The air outlet assembly 7 is configured to exhaust air from the retractable member 31 so that the interior of the retractable member 31 has the same vacuum degree as the process cavity 1. Specifically, the vacuum pump is started to extract air out of the retractable member 31 so that the interior of the retractable member 31 has the same vacuum degree as the process cavity 1.

Figure 5:
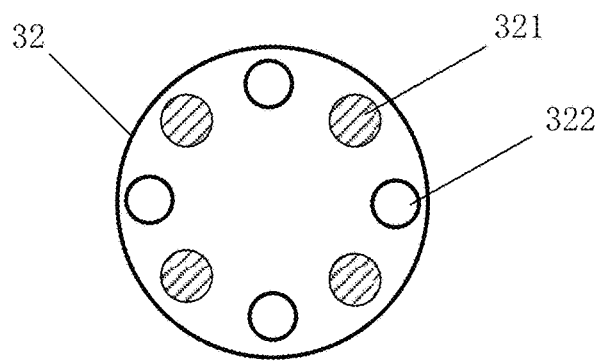
FIG. 5 is a structural schematic view of the cover in FIG. 1.

FIG. 5 is a structural schematic view of the cover 32 in FIG. 1. As shown in FIG. 5, in the exemplary embodiment of the disclosure, the cover 32 is provided with a first via 321 and a first screw hole 322.

Figure 6:
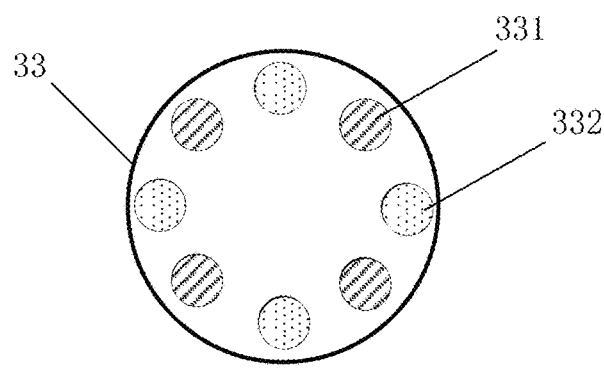
FIG. 6 is a structural schematic view of the first connecting member in FIG. 1.

FIG. 6 is a structural schematic view of the first connecting member 33 in FIG. 1. As shown in FIG. 6, in the exemplary embodiment of the disclosure, the first connecting member 33 is provided with a second screw hole 331 corresponding to the first via 321 on the cover 32, and a third screw hole 332 corresponding to the first screw hole 322 on the cover 32. It should be appreciated that the central hollow portion of the first connecting member 33 is not specifically shown in FIG. 6.

It should be noted that both of the first via 321 and the first screw hole 322 penetrate the cover 32, the second screw hole 331 penetrate the first connecting member 33, but the third screw hole 332 does not penetrate the first connecting member 33. In the exemplary embodiment of the disclosure, the film thickness test apparatus further includes a screw which is disposed in the first screw hole 322 and the third screw hole 332 so that the connecting member 33 is fixed on the cover 32.

In the exemplary embodiment of the disclosure, the first connecting member 33 and the second connecting member 34 are both flanges.

In the exemplary embodiment of the disclosure, the drive assembly 2 is a drive screw which is disposed outside of and connected to the transport assembly 3. Specifically, one end of the drive screw is fixed on one end of the second connecting member 34, while the other end of the drive screw is disposed in the second screw hole 331 on the first connecting member 33 and the corresponding first via 321 on the cover 32. The drive screw is configured to operate to drive the transport assembly 3 to move along a direction towards/away from the process cavity 1. Specifically, the drive screw operates to drive the first connecting member 33 and the cover 32 to move along a direction towards/away from the process cavity 1 so as to drive the one end of the retractable member 31 to move along a direction towards/away from the process cavity 1.

In the exemplary embodiment of the disclosure, the film thickness test apparatus further includes a switch assembly 8 which has one end connected to the other end of the second connecting member 34, and the other end connected to the process cavity 1. The switch assembly 8 is configured to control communication/isolation between the transport assembly 3 and the process cavity 1. Specifically, the switch assembly 8 is configured to control communication/isolation between the retractable member 31 and the process cavity 1. In the exemplary embodiment of the disclosure, the switch assembly 8 is connected to the second connecting member 34 by a screw.

In the exemplary embodiment of the disclosure, the switch assembly 8 is further provided at the other end with a third connecting member 9 connected to the process cavity 1. That is, the switch assembly 8 is connected to the process cavity 1 through the third connecting member 9. In the exemplary embodiment of the disclosure, the third connecting member 9 has a hollow interior in communication with the process cavity 1. In the exemplary embodiment of the disclosure, the third connecting member 9 is a flange.

Figure 2:
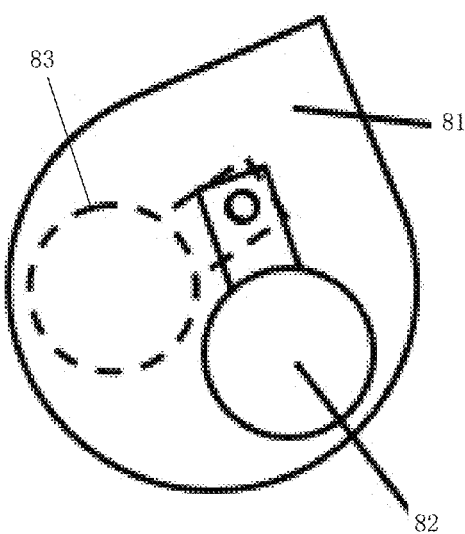
FIG. 2 is a structural schematic view of the switch assembly in FIG. 1.

In the exemplary embodiments of the disclosure, the switch assembly 8 is a pendulum valve. FIG. 2 is a structural schematic view of the switch assembly 8 in FIG. 1. As shown in FIG. 2, the pendulum valve includes a pendulum body 81 with an access port 83 and a pendulum cover 82. The pendulum cover 82 is configured to control communication/isolation between the retractable member 31 and the process cavity 1. Specifically, the retractable member 31 is controlled to be isolated from the process cavity 1 when the pendulum cover 82 covers the access port 83. More specifically, the pendulum cover 82 is moved towards the access port 83 in a clockwise direction to cover the access port 83 so as to control the retractable member 31 to be isolated from the process cavity 1. When the pendulum cover 82 does not cover the access port 83, the retractable member 31 is controlled to be in communication with the process cavity 1. More specifically, the pendulum cover 82 is moved away from the access port 83 in a counterclockwise direction to uncover the access port 83 so as to control the retractable member 31 to be in communication the process cavity 1. When needing to enter the process cavity 1, the test assembly 4 may pass through the access port 83 to get into the process cavity 1. It should be noted that how the pendulum cover 82 is moved to cover/uncover the access port 83 is not limited in this exemplary embodiment, and the above clockwise and counterclockwise methods are merely illustrative. Detailed examples are not listed one by one herein.

Figure 3:
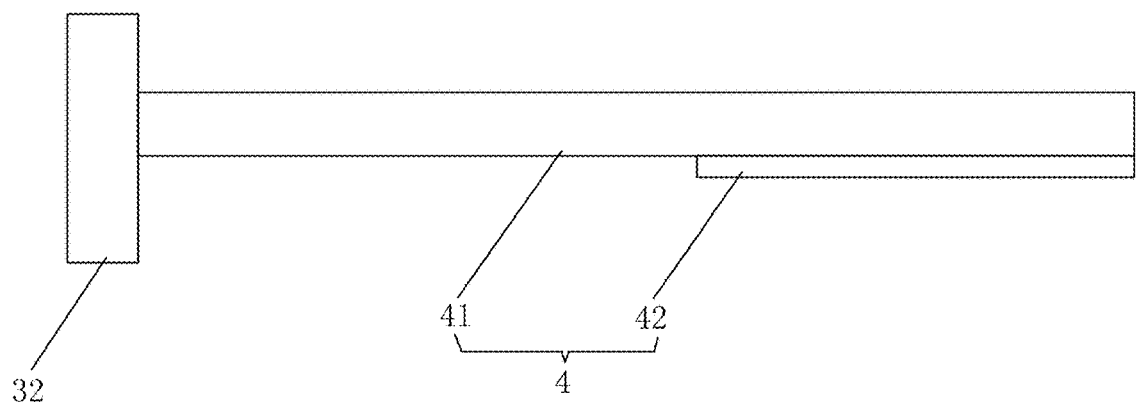
FIG. 3 is a structural schematic view of the test assembly in FIG. 1.

FIG. 3 is a structural schematic view of the test assembly in FIG. 1. As shown in FIG. 3, the test assembly 4 includes a toolbar 41 and a substrate 42. One side of the substrate 42 is fixed on the toolbar 41, and the other side of the substrate 42 is used for vapor deposition of the test film. The toolbar 41 has one end fixed on one end of the transport assembly 3 and is located within the transport assembly 3. Specifically, the toolbar 41 has one end fixed on one side of the cover 32 and is located within the retractable member 31.

In the exemplary embodiment of the disclosure, the retractable member 31 is configured to, when the one end is moved towards the process cavity 1, drive the toolbar 41 and the substrate 42 into the process cavity 1 so that the substrate 42 is vapor deposited in the process cavity 1 to form a test film, and, when the one end is moved away from the process cavity 1, drive the toolbar 41 and the substrate 42 out of the process cavity 1.

In the exemplary embodiment of the disclosure, the substrate 42 is a silicon wafer or white glass. In practical applications, the substrate 42 may also be other structures, which will not be listed herein one by one.

The operating principles of the film thickness test apparatus according to the exemplary embodiment of the disclosure will now be further explained in detail with reference to FIGS. 1-4.

Figure 4:
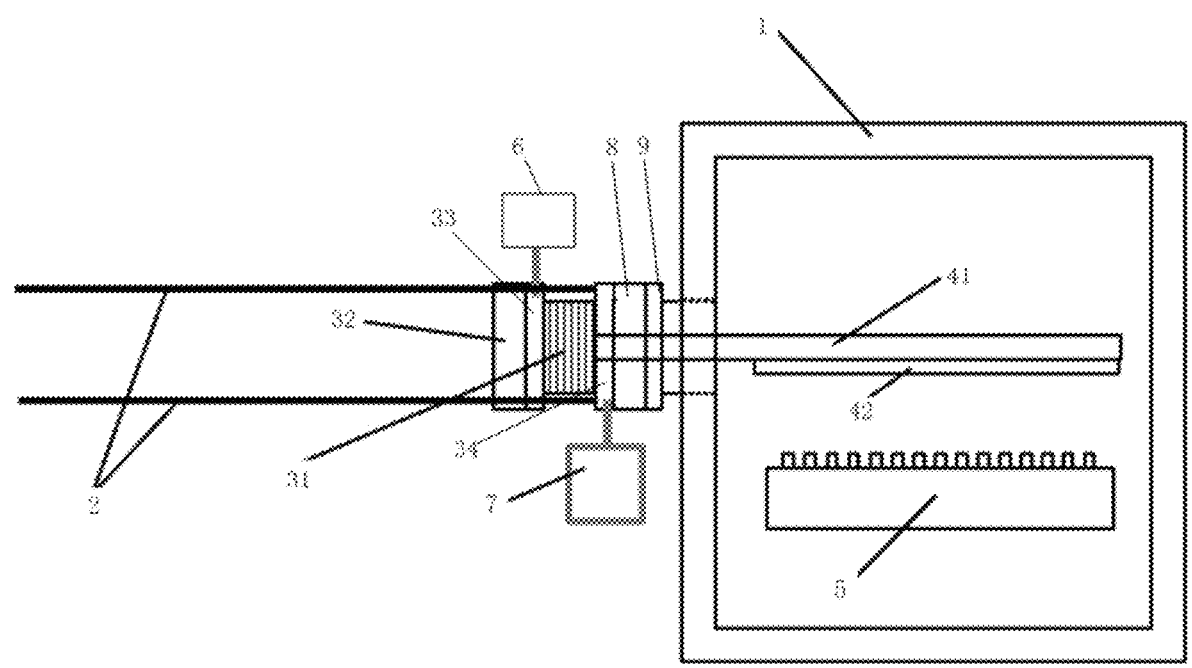
FIG. 4 is a schematic diagram illustrating a state in which the test assembly in FIG. 1 enters the process cavity and is vapor deposited to form a test film.

It should be noted that FIG. 1 shows an initial state of the film thickness test apparatus (i.e., a non-operating state or a state where the test assembly 4 exits the process cavity 1 during operation). FIG. 4 is a schematic diagram illustrating a state in which the test assembly in FIG. 1 enters the process cavity and is vapor deposited to form a test film.

Firstly, the air inlet assembly 6 is closed to isolate the interior of retractable member 31 from the ambient air so that the interior of the retractable member 31 is in a closed but not vacuum state. In order to prevent air inside of the retractable member 31 from entering the process cavity 1 to affect vapor deposition of the test film, the vacuum pump (air outlet assembly 7) is desired to be started to exhaust the air in the retractable member 31 so that the interior of the retractable member 31 has the same vacuum degree as the process cavity 1. After adjusting the vacuum degree of the interior of the retractable member 31, the pendulum cover 82 of the pendulum valve (switch assembly 8) is opened. At this time, the pendulum cover 82 does not cover the access port 83 so that the retractable member 31 is in communication with the process cavity 1 through the access port 83.

After that, the drive screw (drive assembly 2) is started, and, by operating to drive one end of the retractable member 31 to move along a direction towards the process cavity 1, the drive screw drives the toolbar 41 connected to the one end of the retractable member 31 to move along a direction towards the process cavity 1. After the toolbar 41 enters the process cavity 1, the driving of the drive screw is stopped. Then, the evaporation source 5 is operated to deposit the test film on the substrate 42 of the toolbar 41.

After the vapor deposition is finished, the drive screw is started again to drive the one end of the retractable member 31 to move along a direction away from the process cavity 1, so as to drive the toolbar 41 connected to the one end of the retractable member 31 to move along a direction away from the process cavity 1 until the toolbar 41 totally exits the process cavity 1.

After that, the pendulum cover 82 of the pendulum valve is closed. At this time, the pendulum cover 82 covers the access port 83 so that the retractable member 31 is isolated from the process cavity 1. Then, the air inlet assembly 6 is opened to make the interior of the retractable member 31 communicate with the ambient air so that the interior of the retractable member 31 is in an atmospheric state.

Finally, the toolbar 41 is taken out of the film thickness test apparatus to test a thickness of the test film deposited on the substrate 42. The thickness data is used as a basis for adjusting a deposition rate parameter of the evaporation source to correct the deposition rate parameter of the evaporation source.

Figure 7:
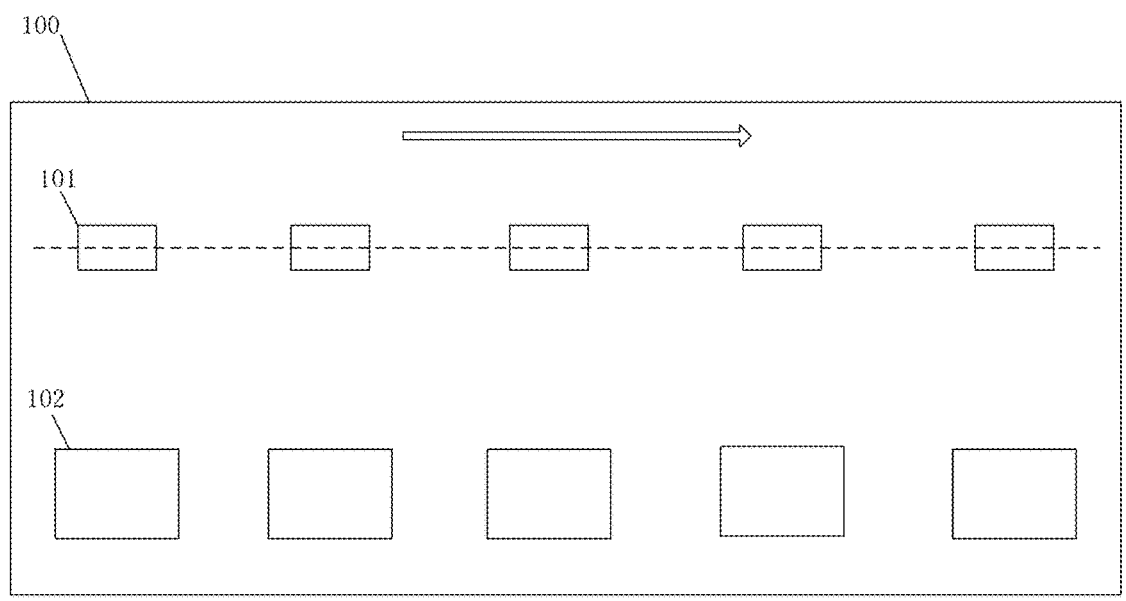
FIG. 7 is a schematic diagram illustrating an application of the film thickness test apparatus in FIG. 1.

FIG. 7 is a schematic diagram illustrating an application of the film thickness test apparatus in FIG. 1. As shown in FIG. 7, the film thickness test apparatus 101 is disposed at a tapeout level (shown by the dash lines) in the vapor deposition device 100. Each of the film thickness test apparatus 101 corresponds to a process cavity, and each of the process cavities is correspondingly provided with an evaporation source 102, i.e., each film thickness test apparatus 101 corresponds to an evaporation source 102. Therefore, in practical production, a film thickness test may be conducted on test films deposited by all of the evaporation sources 102 to be tested through respective film thickness test apparatus 101 without stopping evaporation of the evaporation source 102 (e.g., by covering the evaporation source with an evaporation source cover). The vapor deposition device 100 is desired to be interrupted for only a short period of time during the production process, and does not need to make space for the transport path. In the prior art, there is only one film thickness test apparatus provided in the whole tapeout direction (indicated by the arrow), and the vapor deposition device is desired to be stopped to make space for the transport path of the carrier. Further, when a film thickness test is conducted on the test film deposited by a certain evaporation source, the evaporation of the rest evaporation sources needs to be stopped (e.g., by covering the evaporation source with a movable evaporation source cover). By this way, the film thickness of the test films deposited by each of the evaporation sources are tested one by one, and the production of the vapor deposition device is not restored until such test of all evaporation sources are finished. For example, if there are 10 evaporation sources disposed in the vapor deposition device, for the prior art, the production of the vapor deposition device is required to be stopped for 10 minutes to test the film thickness of the test film deposited by any one of the evaporation sources. Thus, completing the film thickness test of the test films deposited by all the evaporation sources requires stopping production of the vapor deposition device for 10*10=100 minutes. In contrast, the vapor deposition device according to the exemplary embodiment of the disclosure only needs to stop production of the vapor deposition device for 10 minutes to complete the film thickness test of the test films deposited by all the evaporation sources. Therefore, compared with the prior art, the film thickness test apparatus according to the exemplary embodiment of the disclosure optimizes production scheduling, saves time spent on film thickness test, improves productivity, saves film materials and reduces risks of hole blockage on the evaporation source, thereby improving the production reliability during continuous production.

According to another aspect of the disclosure, there is provided a vapor deposition device comprising a plurality of process cavities, each of which corresponding to one film thickness test apparatus as discussed above. For detailed description about the film thickness test apparatus, please refer to the above description, which will not be repeated here.

In the vapor deposition device according to the exemplary embodiment of the disclosure, the film thickness test apparatus is arranged for one process cavity, the drive assembly is configured to drive the transport assembly to move along a direction towards/away from the process cavity, the transport assembly is configured to, when moving towards the process cavity, drive the test assembly to enter the corresponding process cavity so that the test assembly is vapor deposited in the process cavity to form a test film, and, when moving away from the process cavity, drive the test assembly out of the corresponding process cavity. In practical applications, by merely stopping the vapor deposition device for a short period of time during the production, the film thickness test of the test films deposited by all the evaporation sources can be completed at the same time without stopping operation of the evaporation sources, thereby optimizing the production scheduling, saving time spent on film thickness test, improving productivity, saving film materials and reducing risks of hole blockage on the evaporation source, and thus improving the production reliability during continuous production.

Figure 8:
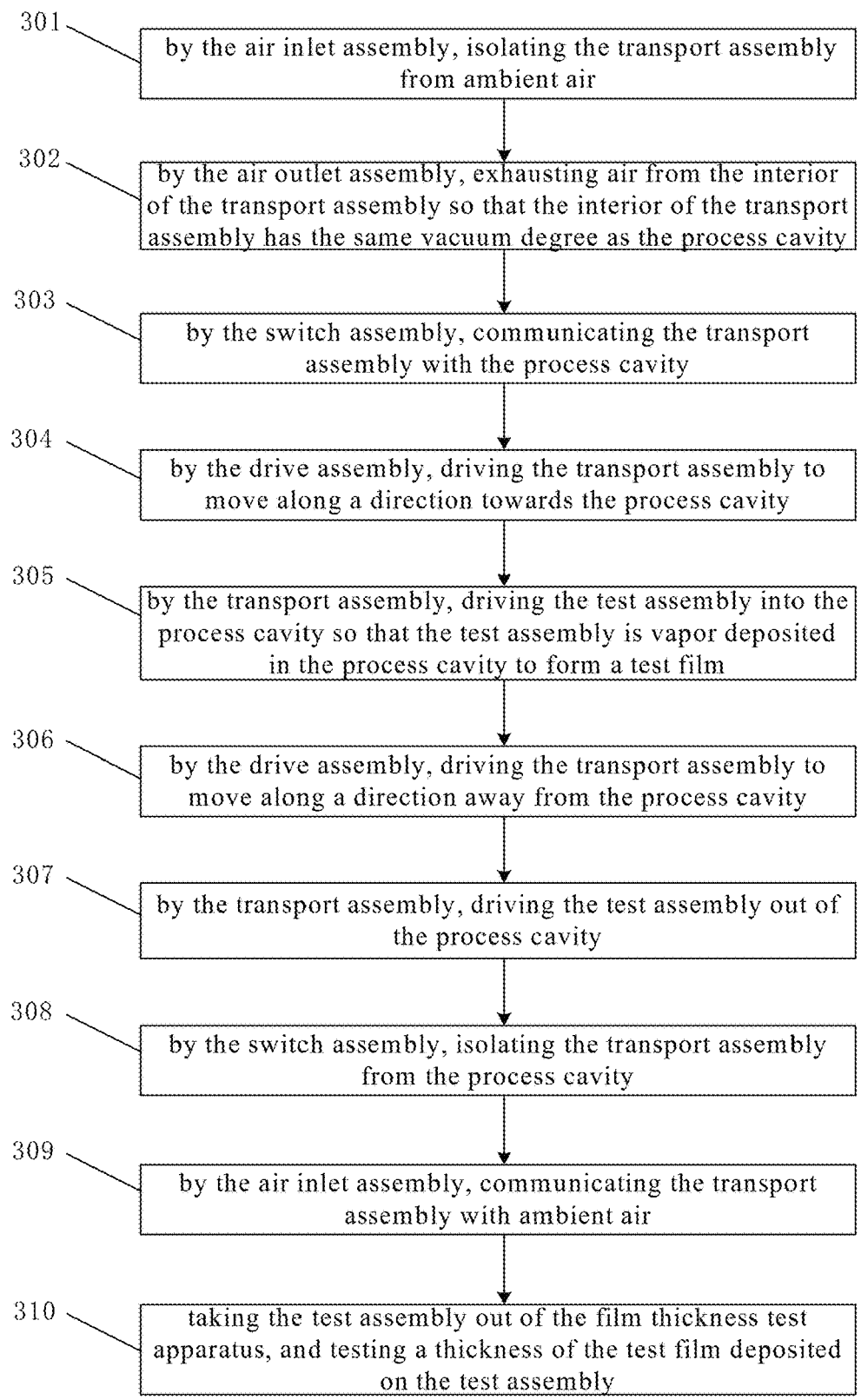
FIG. 8 is a flowchart of the film thickness test method according to an exemplary embodiment of the disclosure.

According to still another aspect of the disclosure, there is provided a film thickness test method. FIG. 8 is a flowchart of the film thickness test method based on the above discussed film thickness test apparatus according to an exemplary embodiment of the disclosure. As shown in FIG. 8, the film thickness test method includes:

At step 301, by the air inlet assembly, isolating the transport assembly from ambient air.

In the exemplary embodiment of the disclosure, the transport assembly includes a cover, a retractable member, a first connecting member and a second connecting member. Specifically, by the air inlet assembly, isolating the retractable member from ambient air. More specifically, closing the air inlet assembly so that the interior of the retractable member is isolated from the ambient air.

At step 302, by the air outlet assembly, exhausting air from the interior of the transport assembly so that the interior of the transport assembly has the same vacuum degree as the process cavity.

Specifically, by the air outlet assembly, exhausting air from the interior of the retractable member so that the interior of the retractable member has the same vacuum degree as the process cavity.

In the exemplary embodiments of the disclosure, the air outlet assembly is a vacuum pump.

More specifically, since the interior of the retractable member has not been in a vacuum state yet, in order to prevent the air at the interior of the retractable member from entering the process cavity and affect vapor deposition of the test film, it is desired to start the vacuum pump to exhaust the air in the retractable member so that the interior of the retractable member has the same vacuum degree as the process cavity.

At step 303, by the switch assembly, communicating the transport assembly with the process cavity.

Specifically, by the switch assembly, communicating the retractable member with the process cavity.

In the exemplary embodiments of the disclosure, the switch assembly is a pendulum valve including a pendulum body with an access port and a pendulum cover.

More specifically, opening the pendulum cover so that the pendulum cover uncovers the access port and the retractable member is in communication with the process cavity.

At step 304, by the drive assembly, driving the transport assembly to move along a direction towards the process cavity.

Specifically, the other end of the retractable member is fixed, and the drive assembly drives the retractable member to be compressed so that the one end of the retractable member is moved towards the process cavity.

In the exemplary embodiments of the disclosure, the drive assembly is a drive screw.

Specifically, starting the drive screw, and, by operation of the drive screw, driving the first connecting member and the cover to move along a direction towards the process cavity so as to drive the one end of the retractable member to move along a direction towards the process cavity.

At step 305, by the transport assembly, driving the test assembly into the process cavity so that the test assembly is vapor deposited in the process cavity to form a test film.

In the exemplary embodiment of the disclosure, the test assembly includes a toolbar and a substrate fixed on the toolbar.

Specifically, the one end of the retractable member is moved towards the process cavity to drive the toolbar to move along a direction towards the process cavity so that the toolbar enters the process cavity and is vapor deposited to form a test film. The test film is deposited by the evaporation source in the process cavity and formed on the substrate.

At step 306, by the drive assembly, driving the transport assembly to move along a direction away from the process cavity.

Specifically, the other end of the retractable member is fixed, and the drive assembly drives the retractable member to be stretched so that the one end of the retractable member is moved away from the process cavity.

More specifically, starting the drive screw, and, by operation of the drive screw, driving the first connecting member and the cover to move along a direction away from the process cavity so as to drive the one end of the retractable member to move along a direction away from the process cavity.

At step 307, by the transport assembly, driving the test assembly out of the process cavity.

Specifically, when the vapor deposition of the test film is finished, the one end of the retractable member is moved away from the process cavity to drive the toolbar to move along a direction away from the process cavity until the toolbar exits the process cavity.

At step 308, by the switch assembly, isolating the transport assembly from the process cavity.

Specifically, by the switch assembly, isolating the retractable member from the process cavity.

More specifically, closing the pendulum cover of the pendulum valve so that the pendulum cover covers the access port and the retractable member is isolated from the process cavity.

At step 309, by the air inlet assembly, communicating the transport assembly with ambient air.

Specifically, by the air inlet assembly, communicating the retractable member with ambient air.

More specifically, opening the air inlet assembly so that the interior of the retractable member is in communication with the ambient air.

At step 310, taking the test assembly out of the film thickness test apparatus, and testing a thickness of the test film deposited on the test assembly.

Specifically, taking the toolbar out of the film thickness test apparatus, and testing the thickness of the test film deposited on the substrate.

Please refer to the above discussion for other detailed description of the film thickness test apparatus according to the exemplary embodiment of the disclosure, which will not be repeated here.

In the film thickness test method according to the exemplary embodiment of the disclosure, the film thickness test apparatus is arranged for one process cavity, the drive assembly drives the transport assembly to move along a direction towards/away from the process cavity, the transport assembly is configured to, when moving towards the process cavity, drive the test assembly to enter the process cavity so that the test assembly is vapor deposited in the process cavity to form a test film, and, when moving away from the process cavity, drive the test assembly out of the process cavity. In practical applications, by merely stopping the vapor deposition device for a short period of time during the production, the film thickness test of the test films deposited by all the evaporation sources can be completed at the same time without stopping operation of the evaporation sources, thereby optimizing the production scheduling, saving time spent on film thickness test, improving productivity, saving film materials and reducing risks of hole blockage on the evaporation source, and thus improving the production reliability during continuous production.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A film thickness test apparatus arranged for one process cavity, the film thickness test apparatus comprising:
   a test assembly;
   a transport assembly configured to, when moving towards the process cavity, drive the test assembly into the process cavity so that the test assembly is vapor deposited in the process cavity to form a test film, and, when moving away from the process cavity, drive the test assembly out of the process cavity; and
   a drive assembly configured to drive the transport assembly to move along a direction towards/away from the process cavity,
   wherein the transport assembly comprises a retractable member which has a hollow interior, and the retractable member has one end connected to one end of the test assembly within the retractable member while the other end is connected to the process cavity.

2. The film thickness test apparatus according to claim 1,
wherein the drive assembly is configured to drive the retractable member to stretch/retract so that the one end of the retractable member is moved along a direction towards/away from the process cavity; and
wherein the retractable member is configured to, when the one end of the retractable member is moved towards the process cavity, drive the test assembly into the process cavity so that the test assembly is vapor deposited in the process cavity to form a test film, and, when the one end of the retractable member is moved away from the process cavity, drive the test assembly out of the process cavity.

3. The film thickness test apparatus according to claim 2, wherein the transport assembly further comprises a cover, the one end of the retractable member is connected to one side of the cover, the one end of the test assembly is fixed on the one side of the cover, and the one end of the retractable member is connected to the one end of the test assembly via the cover.

4. The film thickness test apparatus according to claim 3, further comprising:
an air inlet assembly in communication with the retractable member and configured to control isolation or communication between the retractable member and ambient air; and
an air outlet assembly in communication with the retractable member and configured to exhaust air from the interior of the retractable member so that the interior of the retractable member has the same vacuum degree as the process cavity.

5. The film thickness test apparatus according to claim 4, wherein the transport assembly further comprises:
a first connecting member having one end fixed on and in communication with the one end of the retractable member and the other end fixed on the one side of the cover, the one end of the retractable member being connected to the one side of the cover via the first connecting member; and
a second connecting member having one end fixed on and in communication with the other end of the retractable member and the other end connected to the process cavity, the other end of the retractable member being connected to the process cavity via the second connecting member.

6. The film thickness test apparatus according to claim 5, further comprising:
a switch assembly having one end connected to the other end of the second connecting member and the other end connected to the process cavity, the other end of the second connecting member being connected to the process cavity via the switch assembly, and the switch assembly being configured to control isolation or communication between the retractable member and the process cavity.

7. The film thickness test apparatus according to claim 6, wherein the switch assembly is a pendulum valve.

8. The film thickness test apparatus according to claim 1, wherein the test assembly comprises:
a toolbar having one end fixed on one end of the transport assembly and is located within the transport assembly; and
a substrate having one side fixed on the toolbar and the other side configured for vapor deposition of the test film.

9. The film thickness test apparatus according to claim 3, wherein the test assembly comprises:
a toolbar having one end fixed on the one end of the transport assembly and is located within the transport assembly; and
a substrate having one side fixed on the toolbar and the other side configured for vapor deposition of the test film.

10. The film thickness test apparatus according to claim 9, wherein the one end of the toolbar is fixed onto the one side of the cover.

11. The film thickness test apparatus according to claim 1, wherein the drive assembly is a drive screw, which is disposed on two external sides of the transport assembly and connected to the transport assembly; and
wherein the drive screw operates to drive the transport assembly to move along a direction towards/away from the process cavity.

12. The film thickness test apparatus according to claim 5, wherein the drive assembly is a drive screw, which is disposed on two external sides of the transport assembly and connected to the transport assembly; and
wherein the drive screw operates to drive the transport assembly to move along a direction towards/away from the process cavity.

13. The film thickness test apparatus according to claim 12,
wherein the cover is provided with a first via and a first screw hole both penetrating the cover, and the first connecting member is provided with a second screw hole penetrating the first connecting member and corresponding to the first via on the cover, and a third screw hole not penetrating the first connecting member and corresponding to the first screw hole on the cover.

14. The film thickness test apparatus according to claim 13, further comprising:
a screw disposed in the first and third screw holes so that the first connecting member is fixed on the cover.

15. The film thickness test apparatus according to claim 13,
wherein one end the drive screw is fixed on the one end of the second connecting member, and the other end of the drive screw is disposed in the second screw hole and the first via.

16. The film thickness test apparatus according to claim 2, wherein the retractable member is a bellows.

17. The film thickness test apparatus according to claim 5, wherein the air inlet assembly is in communication with the first connecting member, and the air outlet assembly is in communication with the second connecting member.

18. A vapor deposition device comprising a plurality of process cavities, each of which corresponding to one film thickness test apparatus according to claim 1.

* * * * *